(12) United States Patent
Tang et al.

(10) Patent No.: US 9,590,767 B2
(45) Date of Patent: Mar. 7, 2017

(54) SIGNAL PROCESSING METHOD AND DEVICE

(71) Applicant: Huawei Technologies Co., Ltd., Shenzhen (CN)

(72) Inventors: Xin Tang, Shanghai (CN); Chunjie Yang, Shanghai (CN); Ming Li, Shanghai (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/078,829

(22) Filed: Mar. 23, 2016

(65) Prior Publication Data

US 2016/0218826 A1    Jul. 28, 2016

Related U.S. Application Data

(63) Continuation of application No. PCT/CN2014/080320, filed on Jun. 19, 2014.

(30) Foreign Application Priority Data

Sep. 23, 2013   (CN) .......................... 2013 1 0436667

(51) Int. Cl.
*H04W 4/00*        (2009.01)
*H04L 1/00*        (2006.01)
(Continued)

(52) U.S. Cl.
CPC .......... *H04L 1/0045* (2013.01); *H03M 13/45* (2013.01); *H04L 1/0061* (2013.01);
(Continued)

(58) Field of Classification Search
CPC ............... H04L 1/0045; H04L 1/0061; H04W 36/0005; H04W 52/12; H04W 52/40; H04M 13/45
(Continued)

(56) References Cited

U.S. PATENT DOCUMENTS 6,148,422 A * 11/2000 Strawczynski ........... H04L 1/24
                                                        714/704
6,795,416 B1 * 9/2004 Han ....................... H04B 1/707
                                                        370/335

(Continued)

FOREIGN PATENT DOCUMENTS

CN          1855795 A      11/2006
CN        102546131 A       7/2012
(Continued)

*Primary Examiner* — Dominic Rego
(74) *Attorney, Agent, or Firm* — Leydig, Voit & Mayer, Ltd.

(57) ABSTRACT

Embodiments of the present disclosure provide a signal processing method and device. The method includes: receiving soft information corresponding to encoded signals sent by at least two base stations and CRC check results of decoding results of first subflows in the encoded signals, where the soft information includes first soft information corresponding to the first subflows; obtaining a selective combining result of the first subflows by performing selective combining according to the at least two CRC check results of the decoding results of the first subflows; and if the selective combining result of the first subflows is that CRC check is incorrect, determining a soft combining result of the first subflows according to at least two pieces of the first soft information. The signal processing method and device provided in the embodiments can increase a signal gain.

13 Claims, 4 Drawing Sheets

Receive soft information corresponding to encoded signals sent by at least two base stations and CRC check results of decoding results of first subflows in the encoded signals, to obtain at least two pieces of the soft information and at least two CRC check results of the decoding results of the first subflows, where the soft information includes first soft information corresponding to the first subflows  ⟶ 101

Obtain a selective combining result of the first subflows by performing selective combining according to the at least two CRC check results of the decoding results of the first subflows  ⟶ 102

If the selective combining result of the first subflows is that CRC check is incorrect, determine a soft combining result of the first subflows according to at least two pieces of the first soft information  ⟶ 103

(51) Int. Cl.
  *H04W 36/00* (2009.01)
  *H03M 13/45* (2006.01)
  *H04W 52/12* (2009.01)
  *H04W 52/40* (2009.01)

(52) U.S. Cl.
  CPC ....... *H04W 36/0005* (2013.01); *H04W 52/12* (2013.01); *H04W 52/40* (2013.01)

(58) Field of Classification Search
  USPC ...................... 455/560, 422.1, 524, 525, 436
  See application file for complete search history.

(56) References Cited

U.S. PATENT DOCUMENTS

| | | | |
|---|---|---|---|
| 7,272,416 | B2 | 9/2007 | Sano |
| 9,325,594 | B2* | 4/2016 | Racz ..................... H04L 1/1621 |
| 2002/0108086 | A1* | 8/2002 | Irvin ....................... H04L 1/004 |
| | | | 714/758 |
| 2007/0190997 | A1* | 8/2007 | Moon .................... H04B 7/022 |
| | | | 455/422.1 |
| 2009/0249155 | A1 | 10/2009 | Mayrench et al. |
| 2014/0089770 | A1 | 3/2014 | Wei et al. |

FOREIGN PATENT DOCUMENTS

| | | |
|---|---|---|
| CN | 102907030 A | 1/2013 |
| CN | 103490858 A | 1/2014 |
| EP | 2706709 A2 | 3/2014 |
| WO | WO 2011039134 A1 | 4/2011 |

* cited by examiner

SIGNAL PROCESSING METHOD AND DEVICE

CROSS-REFERENCE TO RELATED APPLICATIONS

This application is a continuation of International Patent Application No. PCT/CN2014/080320, filed on Jun. 19, 2014, which claims priority to Chinese Patent Application No. 201310436667.1, filed on Sep. 23, 2013, both of which are hereby incorporated by reference in their entireties.

TECHNICAL FIELD

Embodiments of the present disclosure relate to communications technologies, and in particular, to a signal processing method and device.

BACKGROUND

In a mobile communications system, when a mobile station in a connected state moves from one cell to another cell, to prevent communication from being interrupted, a communications network control system usually starts a handover process to ensure service transmission of the mobile station. A handover technology used in a Wideband Code Division Multiple Access (WCDMA) system mainly includes an intra-system hard handover, an inter-system hard handover, a soft handover, and a softer handover.

For a soft handover, a mobile station is located in an overlapped part covered by two sectors of different base stations. In a downlink direction from the base stations to the mobile station, the mobile station simultaneously communicates with the two base stations by using air interface channels from the two base stations, and receives, by using a Rake receiver and in a manner of maximum ratio combining, signals transmitted by the two air interface channels. In an uplink direction from the mobile station to the two base stations, the two base stations receive encoded signals sent by the mobile station, decode the encoded signals, and send decoding results and cyclic redundancy check (CRC) check results to a radio network controller (RNC); and the RNC performs selective combining according to the CRC check results, and sends a result of the selective combining to a core network, to perform a subsequent communication process.

However, as the RNC performs selective combining according to the CRC check results, a macro diversity gain of the soft handover cannot be fully used, so that a maximum gain of a signal cannot be obtained.

SUMMARY

Embodiments of the present disclosure provide a signal processing method and device, to increase a signal gain.

According to a first aspect, an embodiment of the present disclosure provides a signal processing method, including:

receiving soft information corresponding to encoded signals sent by at least two base stations and cyclic redundancy check CRC check results of decoding results of first subflows in the encoded signals, to obtain at least two pieces of the soft information and at least two CRC check results of the decoding results of the first subflows, where the soft information includes first soft information corresponding to the first subflows;

obtaining a selective combining result of the first subflows by performing selective combining according to the at least two CRC check results of the decoding results of the first subflows; and if the selective combining result of the first subflows is that CRC check is incorrect, determining a soft combining result of the first subflows according to at least two pieces of the first soft information.

With reference to the first aspect, in a first possible implementation manner of the first aspect, the first soft information is first demodulation soft information, and the determining a soft combining result of the first subflows according to at least two pieces of the first soft information includes:

obtaining first accumulated demodulation soft information by accumulating at least two pieces of the first demodulation soft information; and acquiring a first accumulated decoding result by decoding the first accumulated demodulation soft information, and using the first accumulated decoding result as the soft combining result of the first subflows.

With reference to the first aspect, in a second possible implementation manner of the first aspect, the first soft information is first decoding soft information, and the determining a soft combining result of the first subflows according to at least two pieces of the first soft information includes:

obtaining first accumulated decoding soft information by accumulating at least two pieces of the first decoding soft information; and performing hard decision on the first accumulated decoding soft information, and using a hard decision result as the soft combining result of the first subflows.

With reference to the first or second possible implementation manner of the first aspect, in a third possible implementation manner of the first aspect, the encoded signals further include second subflows and third subflows, and the soft information further includes second demodulation soft information corresponding to the second subflows and third demodulation soft information corresponding to the third subflows; and the method further includes:

obtaining second accumulated demodulation soft information by accumulating at least two pieces of the second demodulation soft information, acquiring a second accumulated decoding result by decoding the second accumulated demodulation soft information, and using the second accumulated decoding result as a first soft combining result of the second subflows; and obtaining third accumulated demodulation soft information by accumulating at least two pieces of the third demodulation soft information, acquiring a third accumulated decoding result by decoding the third accumulated demodulation soft information, and using the third accumulated decoding result as a first soft combining result of the third subflows.

With reference to the first or second possible implementation manner of the first aspect, in a fourth possible implementation manner of the first aspect, the encoded signals further include second subflows and third subflows, and the soft information further includes second decoding soft information corresponding to the second subflows and third decoding soft information corresponding to the third subflows; and the method further includes:

obtaining second accumulated decoding soft information by accumulating at least two pieces of the second decoding soft information, performing hard decision on the second accumulated decoding soft information, and using a hard decision result as a second soft combining result of the second subflows; and obtaining third accumulated decoding soft information by accumulating at least two pieces of the third decoding soft information, performing hard decision on the third accumulated decoding soft information, and using a hard decision result as a second soft combining result of the third subflows.

With reference to the first or second possible implementation manner of the first aspect, in a fifth possible implementation manner of the first aspect, the encoded signals further include second subflows and third subflows, and the soft information further includes second soft metrics corresponding to the second subflows and third soft metrics corresponding to the third subflows; and the method further includes:

receiving decoding results of the second subflows and decoding results of the third subflows that are sent by the at least two base stations;

comparing the second soft metrics corresponding to the second subflows, and using a decoding result of a second subflow corresponding to a maximum second soft metric as a third soft combining result of the second subflows; and comparing the third soft metrics corresponding to the third subflows, and using a decoding result of a third subflow corresponding to a maximum third soft metric as a third soft combining result of the third subflows.

With reference to any one of the first to fifth possible implementation manners of the first aspect, in a sixth possible implementation manner of the first aspect, before the performing selective combining according to the at least two CRC check results of the decoding results of the first subflows to obtain a selective combining result of the first subflows, the method further includes:

receiving the decoding results of the first subflows sent by the at least two base stations and bit error rates corresponding to the decoding results of the first subflows; and the method further includes:

if the selective combining result of the first subflows is that CRC check is correct, determining, among the decoding results of the first subflows whose CRC check is correct, a decoding result of a first subflow having a lowest bit error rate.

With reference to any one of the first to sixth possible implementation manners of the first aspect, in a seventh possible implementation manner of the first aspect, after the determining a soft combining result of the first subflows according to at least two pieces of the first soft information, the method further includes:

sending the selective combining result of the first subflows to an outer loop power control module, so that the outer loop power control module controls transmit power of a mobile station; or performing CRC check on the soft combining result of the first subflows, and sending a check result to an outer loop power control module, so that the outer loop power control module controls transmit power of a mobile station.

According to a second aspect, an embodiment of the present disclosure provides a signal processing method, including:

receiving an encoded signal sent by a mobile station, where the encoded signal includes a first subflow;

acquiring soft information corresponding to the encoded signal and a cyclic redundancy check CRC check result of a decoding result of the first subflow, where the soft information includes first soft information corresponding to the first subflow; and sending the soft information corresponding to the encoded signal and the CRC check result of the decoding result of the first subflow in the encoded signal to a radio network controller, so that the radio network controller performs selective combining according to the CRC check result of the decoding result of the first subflow in the encoded signal to obtain a selective combining result of the first subflow, and determines a soft combining result of the first subflow according to the first soft information.

With reference to the second aspect, in a first possible implementation manner of the second aspect, the first soft information is first demodulation soft information, or, the first soft information is first decoding soft information.

With reference to the first possible implementation manner of the second aspect, in a second possible implementation manner of the second aspect, the encoded signal further includes a second subflow and a third subflow, and the soft information further includes second demodulation soft information corresponding to the second subflow and third demodulation soft information corresponding to the third subflow.

With reference to the second possible implementation manner of the second aspect, in a third possible implementation manner of the second aspect, the encoded signal further includes a second subflow and a third subflow, the soft information further includes second decoding soft information corresponding to the second subflow and third decoding soft information corresponding to the third subflow.

With reference to the second possible implementation manner of the second aspect, in a fourth possible implementation manner of the second aspect, the encoded signal further includes a second subflow and a third subflow; and before the sending the soft information corresponding to the encoded signal and the CRC check result of the decoding result of the first subflow in the encoded signal to a radio network controller, the method further includes:

encoding a decoding result of the second subflow to obtain an encoded bit of the second subflow, and generating, according to the encoded bit of the second subflow and second demodulation soft information corresponding to the second subflow, a second soft metric corresponding to the second subflow; and encoding a decoding result of the third subflow to obtain an encoded bit of the third subflow, and generating, according to the encoded bit of the third subflow and third demodulation soft information corresponding to the third subflow, a third soft metric corresponding to the third subflow, where the soft information further includes the second soft metric corresponding to the second subflow and the third soft metric corresponding to the third subflow.

With reference to any one of the first to fourth possible implementation manners of the second aspect, in a fifth possible implementation manner of the second aspect, the method further includes:

sending the decoding result of the first subflow in the encoded signal and a bit error rate corresponding to the decoding result of the first subflow to the radio network controller, so that the radio network controller determines a decoding result of a first subflow having a lowest bit error rate.

According to a third aspect, an embodiment of the present disclosure provides a radio network controller, including:

a receiving module, configured to receive soft information corresponding to encoded signals sent by at least two base stations and cyclic redundancy check CRC check results of decoding results of first subflows in the encoded signals, to obtain at least two pieces of the soft information and at least two CRC check results of the decoding results of the first subflows, where the soft information includes first soft information corresponding to the first subflows;

a selective combining module, configured to obtain a selective combining result of the first subflows by performing selective combining according to the at least two CRC check results of the decoding results of the first subflows; and a soft combining module, configured to: if the selective combining result of the first subflows is that CRC check is incorrect, determine a soft combining result of the first subflows according to at least two pieces of the first soft information.

With reference to the third aspect, in a first possible implementation manner of the third aspect, the first soft information is first demodulation soft information, and the soft combining module is configured to:

obtain first accumulated demodulation soft information by accumulating at least two pieces of the first demodulation soft information; and acquire a first accumulated decoding result by decoding the first accumulated demodulation soft information, and use the first accumulated decoding result as the soft combining result of the first subflows.

With reference to the third aspect, in a second possible implementation manner of the third aspect, the first soft information is first decoding soft information, and the soft combining module is configured to:

obtain first accumulated decoding soft information by accumulating at least two pieces of the first decoding soft information; and perform hard decision on the first accumulated decoding soft information, and use a hard decision result as the soft combining result of the first subflows.

With reference to the first or second possible implementation manner of the third aspect, in a third possible implementation manner of the third aspect, the encoded signals further include second subflows and third subflows, and the soft information further includes second demodulation soft information corresponding to the second subflows and third demodulation soft information corresponding to the third subflows; and the soft combining module is further configured to:

obtain second accumulated demodulation soft information by accumulating at least two pieces of the second demodulation soft information, acquire a second accumulated decoded result by decoding the second accumulated demodulation soft information, and use the second accumulated decoded result as a first soft combining result of the second subflows; and obtain third accumulated demodulation soft information by accumulating at least two pieces of the third demodulation soft information, decode the third accumulated demodulation soft information to acquire a third accumulated decoding result, and use the third accumulated decoding result as a first soft combining result of the third subflows.

With reference to the first or second possible implementation manner of the third aspect, in a fourth possible implementation manner of the third aspect, the encoded signals further include second subflows and third subflows, and the soft information further includes second decoding soft information corresponding to the second subflows and third decoding soft information corresponding to the third subflows; and the soft combining module is further configured to:

obtain second accumulated decoding soft information by accumulating at least two pieces of the second decoding soft information, perform hard decision on the second accumulated decoding soft information, and use a hard decision result as a second soft combining result of the second subflows; and obtain third accumulated decoding soft information by accumulating at least two pieces of the third decoding soft information, perform hard decision on the third accumulated decoding soft information, and use a hard decision result as a second soft combining result of the third subflows.

With reference to the first or second possible implementation manner of the third aspect, in a fifth possible implementation manner of the third aspect, the encoded signals further include second subflows and third subflows, and the soft information further includes second soft metrics corresponding to the second subflows and third soft metrics corresponding to the third subflows; and the receiving module is further configured to:

receive decoding results of the second subflows and decoding results of the third subflows that are sent by the at least two base stations;

compare the second soft metrics corresponding to the second subflows, and use a decoding result of a second subflow corresponding to a maximum second soft metric as a third soft combining result of the second subflows; and compare the third soft metrics corresponding to the third subflows, and use a decoding result of a third subflow corresponding to a maximum third soft metric as a third soft combining result of the third subflows.

With reference to any one of the first to fifth possible implementation manners of the third aspect, in a sixth possible implementation manner of the third aspect, the receiving module is further configured to: before selective combining is performed according to the at least two CRC check results of the decoding results of the first subflows to obtain the selective combining result of the first subflows, receive the decoding results of the first subflows sent by the at least two base stations and bit error rates corresponding to the decoding results of the first subflows; and the radio network controller further includes:

a check module, configured to: if the selective combining result of the first subflows is that CRC check is correct, determine, among the decoding results of the first subflows whose CRC check is correct, a decoding result of a first subflow having a lowest bit error rate.

With reference to any one of the first to sixth possible implementation manners of the third aspect, in a seventh possible implementation manner of the third aspect, the radio network controller further includes:

a sending module, configured to: after the soft combining result of the first subflows is determined according to the at least two pieces of first soft information, send the selective combining result of the first subflows to an outer loop power control module, so that the outer loop power control module controls transmit power of a mobile station; or perform CRC check on the soft combining result of the first subflows, and send a check result to an outer loop power control module, so that the outer loop power control module controls transmit power of a mobile station.

According to a fourth aspect, an embodiment of the present disclosure provides a base station, including:

a receiving module, configured to receive an encoded signal sent by a mobile station, where the encoded signal includes a first subflow;

an acquiring module, configured to acquire soft information corresponding to the encoded signal and a cyclic redundancy check CRC check result of a decoding result of the first subflow, where the soft information includes first soft information corresponding to the first subflow; and a sending module, configured to send the soft information corresponding to the encoded signal and the CRC check result of the decoding result of the first subflow in the encoded signal to a radio network controller, so that the radio network controller performs selective combining according to the CRC check result of the decoding result of the first subflow in the encoded signal to obtain a selective combining result of the first subflow, and determines a soft combining result of the first subflow according to the first soft information.

With reference to the fourth aspect, in a first possible implementation manner of the fourth aspect, the first soft information is first demodulation soft information, or, the first soft information is first decoding soft information.

With reference to the first possible implementation manner of the fourth aspect, in a second possible implementation manner of the fourth aspect, the encoded signal further includes a second subflow and a third subflow, and the soft information further includes second demodulation soft information corresponding to the second subflow and third demodulation soft information corresponding to the third subflow.

With reference to the second possible implementation manner of the fourth aspect, in a third possible implementation manner of the fourth aspect, the encoded signal further includes a second subflow and a third subflow, and the soft information further includes second decoding soft information corresponding to the second subflow and third decoding soft information corresponding to the third subflow.

With reference to the second possible implementation manner of the fourth aspect, in a fourth possible implementation manner of the fourth aspect, the encoded signal further includes a second subflow and a third subflow, and the base station further includes:

an encoding module, configured to: before the soft information corresponding to the encoded signal and the CRC check result of the decoding result of the first subflow in the encoded signal are sent to the radio network controller, encode a decoding result of the second subflow to obtain an encoded bit of the second subflow, and generate, according to the encoded bit of the second subflow and second demodulation soft information corresponding to the second subflow, a second soft metric corresponding to the second subflow; and encode a decoding result of the third subflow to obtain an encoded bit of the third subflow, and generate, according to the encoded bit of the third subflow and third demodulation soft information corresponding to the third subflow, a third soft metric corresponding to the third subflow, where the soft information further includes the second soft metric corresponding to the second subflow and the third soft metric corresponding to the third subflow.

With reference to any one of the first to fourth possible implementation manners of the fourth aspect, in a fifth possible implementation manner of the fourth aspect, the sending module is further configured to:

send the decoding result of the first subflow in the encoded signal and a bit error rate corresponding to the decoding result of the first subflow to the radio network controller, so that the radio network controller determines a decoding result of a first subflow having a lowest bit error rate.

According to a fifth aspect, an embodiment of the present disclosure provides a radio network controller, including:

a receiver, configured to receive soft information corresponding to encoded signals sent by at least two base stations and cyclic redundancy check CRC check results of decoding results of first subflows in the encoded signals, to obtain at least two pieces of the soft information and at least two CRC check results of the decoding results of the first subflows, where the soft information includes first soft information corresponding to the first subflows; and a processor, configured to obtain a selective combining result of the first subflows by performing selective combining according to the at least two CRC check results of the decoding results of the first subflows, and if the selective combining result of the first subflows is that CRC check is incorrect, determine a soft combining result of the first subflows according to at least two pieces of the first soft information.

With reference to the fifth aspect, in a first possible implementation manner of the fifth aspect, the first soft information is first demodulation soft information, the processor is configured to:

obtain first accumulated demodulation soft information by accumulating at least two pieces of the first demodulation soft information; and acquire a first accumulated decoding result by decoding the first accumulated demodulation soft information, and use the first accumulated decoding result as the soft combining result of the first subflows.

With reference to the fifth aspect, in a second possible implementation manner of the fifth aspect, the first soft information is first decoding soft information, and the processor is configured to:

obtain first accumulated decoding soft information by accumulating at least two pieces of the first decoding soft information; and perform hard decision on the first accumulated decoding soft information, and use a hard decision result as the soft combining result of the first subflows.

With reference to the first or second possible implementation manner of the fifth aspect, in a third possible implementation manner of the fifth aspect, the encoded signals further include second subflows and third subflows, and the soft information further includes second demodulation soft information corresponding to the second subflows and third demodulation soft information corresponding to the third subflows; and the processor is further configured to:

obtain second accumulated demodulation soft information by accumulating at least two pieces of the second demodulation soft information, acquire a second accumulated decoding result by decoding the second accumulated demodulation soft information, and use the second accumulated decoding result as a first soft combining result of the second subflows; and obtain third accumulated demodulation soft information by accumulating at least two pieces of the third demodulation soft information, decode the third accumulated demodulation soft information to acquire a third accumulated decoding result, and use the third accumulated decoding result as a first soft combining result of the third subflows.

With reference to the first or second possible implementation manner of the fifth aspect, in a fourth possible implementation manner of the fifth aspect, the encoded signals further include second subflows and third subflows, and the soft information further includes second decoding soft information corresponding to the second subflows and third decoding soft information corresponding to the third subflows; and the processor is further configured to:

obtain second accumulated decoding soft information by accumulating at least two pieces of the second decoding soft information, perform hard decision on the second accumulated decoding soft information, and use a hard decision result as a second soft combining result of the second subflows; and obtain third accumulated decoding soft information by accumulating at least two pieces of the third decoding soft information, perform hard decision on the third accumulated decoding soft information, and use a hard decision result as a second soft combining result of the third subflows.

With reference to the first or second possible implementation manner of the fifth aspect, in a fifth possible implementation manner of the fifth aspect, the encoded signals further include second subflows and third subflows, and the soft information further includes second soft metrics corresponding to the second subflows and third soft metrics corresponding to the third subflows;

the receiver is further configured to receive decoding results of the second subflows and decoding results of the third subflows that are sent by the at least two base stations; and the processor is further configured to:

compare the second soft metrics corresponding to the second subflows, and use a decoding result of a second subflow corresponding to a maximum second soft metric as a third soft combining result of the second subflows; and compare the third soft metrics corresponding to the third subflows, and use a decoding result of a third subflow corresponding to a maximum third soft metric as a third soft combining result of the third subflows.

With reference to any one of the first to fifth possible implementation manners of the fifth aspect, in a sixth possible implementation manner of the fifth aspect, the receiver is further configured to: before selective combining is performed according to the at least two CRC check results of the decoding results of the first subflows to obtain the selective combining result of the first subflows, receive the decoding results of the first subflows sent by the at least two base stations and bit error rates corresponding to the decoding results of the first subflows; and the processor is further configured to:

if the selective combining result of the first subflows is that CRC check is correct, determine, among the decoding results of the first subflows whose CRC check is correct, a decoding result of a first subflow having a lowest bit error rate.

With reference to any one of the first to sixth possible implementation manners of the fifth aspect, in a seventh possible implementation manner of the fifth aspect, the radio network controller further includes: a transmitter, configured to: after the soft combining result of the first subflows is determined according to the at least two pieces of first soft information, send the selective combining result of the first subflows to an outer loop power control module, so that the outer loop power control module controls transmit power of a mobile station; or the processor is further configured to: after the soft combining result of the first subflows is determined according to the at least two pieces of first soft information, perform CRC check on the soft combining result of the first subflows, and a transmitter is further configured to send a check result to an outer loop power control module, so that the outer loop power control module controls transmit power of a mobile station.

According to a sixth aspect, an embodiment of the present disclosure provides a base station, including:

a receiver, configured to receive an encoded signal sent by a mobile station, where the encoded signal includes a first subflow;

a processor, configured to acquire soft information corresponding to the encoded signal and a CRC check result of a decoding result of the first subflow, where the soft information includes first soft information corresponding to the first subflow; and a transmitter, configured to send the soft information corresponding to the encoded signal and the cyclic redundancy check CRC check result of the decoding result of the first subflow in the encoded signal to a radio network controller, so that the radio network controller performs selective combining according to the CRC check result of the decoding result of the first subflow in the encoded signal to obtain a selective combining result of the first subflow, and determines a soft combining result of the first subflow according to the first soft information.

With reference to the sixth aspect, in a first possible implementation manner of the sixth aspect, the first soft information is first demodulation soft information, or, the first soft information is first decoding soft information.

With reference to the first possible implementation manner of the sixth aspect, in a second possible implementation manner of the sixth aspect, the encoded signal further includes a second subflow and a third subflow, and the soft information further includes second demodulation soft information corresponding to the second subflow and third demodulation soft information corresponding to the third subflow.

With reference to the second possible implementation manner of the sixth aspect, in a third possible implementation manner of the sixth aspect, the encoded signal further includes a second subflow and a third subflow, and the soft information further includes second decoding soft information corresponding to the second subflow and third decoding soft information corresponding to the third subflow.

With reference to the second possible implementation manner of the sixth aspect, in a fourth possible implementation manner of the sixth aspect, the encoded signal further includes a second subflow and a third subflow; and the processor is further configured to: before the soft information corresponding to the encoded signal and the CRC check result of the decoding result of the first subflow in the encoded signal are sent to the radio network controller, encode a decoding result of the second subflow to obtain an encoded bit of the second subflow, and generate, according to the encoded bit of the second subflow and second demodulation soft information corresponding to the second subflow, a second soft metric corresponding to the second subflow; and encode a decoding result of the third subflow to obtain an encoded bit of the third subflow, and generate, according to the encoded bit of the third subflow and third demodulation soft information corresponding to the third subflow, a third soft metric corresponding to the third subflow, where the soft information further includes the second soft metric corresponding to the second subflow and the third soft metric corresponding to the third subflow.

With reference to any one of the first to fourth possible implementation manners of the sixth aspect, in a fifth possible implementation manner of the sixth aspect, the transmitter is further configured to:

send the decoding result of the first subflow in the encoded signal and a bit error rate corresponding to the decoding result of the first subflow to the radio network controller, so that the radio network controller determines a decoding result of a first subflow having a lowest bit error rate.

According to the signal processing method and device provided in the embodiments of the present disclosure, an RNC receives soft information corresponding to encoded signals sent by at least two base stations and CRC check results of decoding results of first subflows in the encoded signals, to obtain at least two pieces of the soft information and at least two CRC check results of the decoding results of the first subflows, where the soft information includes first soft information corresponding to the first subflows; performs selective combining according to the at least two CRC check results of the decoding results of the first subflows to obtain a selective combining result of the first subflows; and if the selective combining result of the first subflows is that CRC check is incorrect, determines a soft combining result of the first subflows according to at least two pieces of the first soft information. In the embodiments, not only two decoding processes are performed, in the second decoding process, soft information is used to perform maximum ratio soft combining, so that a macro diversity gain of a soft handover is fully used, thereby greatly improving performance.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
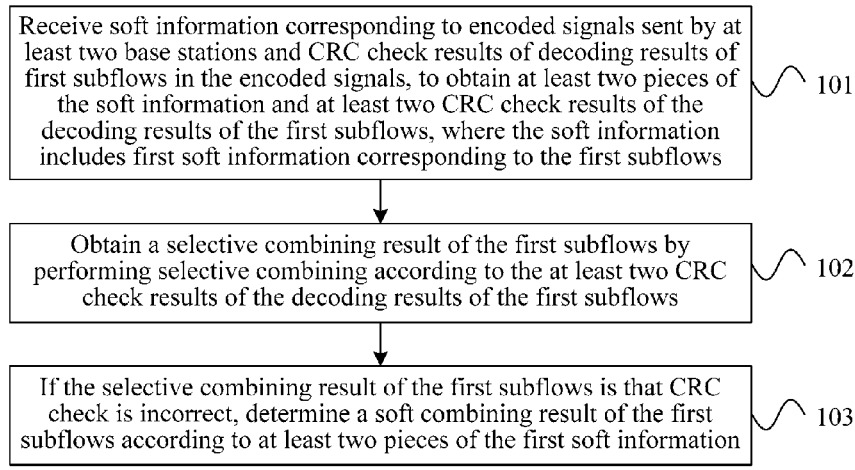
FIG. 1 is a flowchart of Embodiment 1 of a signal processing method according to the present disclosure.

FIG. 1 is a flowchart of Embodiment 1 of a signal processing method according to the present disclosure. An execution body of this embodiment is a base station controller, which may be a base station controller (BSC) in a Global System for Mobile Communications (GSM) system or a code division multiple access (CDMA) 2000 system, or a radio network controller (RNC) in a Wideband Code Division Multiple Access (WCDMA) system, which is not limited in the present disclosure. However, for ease of description, in the following embodiment, an RNC is used as an example for description. The RNC may be implemented by using software and/or hardware. The signal processing method provided in this embodiment includes:

Step 101: Receive soft information corresponding to encoded signals sent by at least two base stations and CRC check results of decoding results of first subflows in the encoded signals, to obtain at least two pieces of the soft information and at least two CRC check results of the decoding results of the first subflows, where the soft information includes first soft information corresponding to the first subflows.

Step 102: Obtain a selective combining result of the first subflows by performing selective combining according to the at least two CRC check results of the decoding results of the first subflows.

Step 103: If the selective combining result of the first subflows is that CRC check is incorrect, determine a soft combining result of the first subflows according to at least two pieces of the first soft information.

In a specific implementation process, this embodiment may be applied to a scenario of a soft handover. In a process of a soft handover, in an uplink direction from a mobile station to at least two base stations, the at least two base stations receive encoded signals sent by the mobile station; the at least two base stations perform processing on the received encoded signals, and send processing results of the encoded signals to an RNC; and the RNC obtains the processing results corresponding to the at least two encoded signals, then performs corresponding processing, and sends final processing results to a core network, so that the core network performs a subsequent communication process.

In step 101, the at least two base stations perform same actions. Each base station sends soft information corresponding to an encoded signal and a CRC check result of a decoding result of a first subflow in the encoded signal to the RNC. In this embodiment, one base station is used as an example for description. In this embodiment, the encoded signal may include only a first subflow, or may further include a second subflow and a third subflow. Particularly, the first subflow includes a cyclic redundancy check (CRC)

code. Herein, detailed description is first given for that the encoded signal includes the first subflow.

In a specific implementation process, there are two possible implementation manners in which the base station performs processing on the received encoded signals sent by the mobile station. Correspondingly, there are also two possible implementation manners in which the RNC receives the soft information sent by the base station. A person skilled in the art may understand that the soft information is a likelihood probability value rather than a binary sequence which consists of 0 and 1 after a decision is made.

In one possible implementation manner, the RNC receives the soft information corresponding to the encoded signals sent by the at least two base stations and the CRC check results of the decoding results of the two first subflows in the encoded signals, where the first soft information is first demodulation soft information.

In a coding process of a source signal (from a mobile station), after passing through a source encoder, a channel encoder, and a modulator, the source signal is converted into an encoded signal suitable for channel transmission. In a transmission process, the encoded signal encounters various types of interference and becomes distorted. Such a distorted encoded signal is transmitted to a receiver of a base station, and needs to be demodulated by a decoding demodulator to turn into a binary or base-n information sequence. In this embodiment of the present disclosure, the decoding demodulator disposed in the base station demodulates a first subflow in the distorted encoded signal into a base-n information sequence of a log-likelihood ratio sequence, where the base-n information sequence is referred to as first demodulation soft information in this embodiment.

At the same time, the base station may decode the first subflow in the encoded signal by using a Turbo decoding algorithm or a Viterbi decoding algorithm to acquire the decoding result of the first subflow. For the decoding algorithm in this embodiment, another decoding algorithm may further be selected, and is not specifically limited in this embodiment. After acquiring the decoding result of the first subflow, the base station performs CRC check on the decoding result of the first subflow, to acquire a CRC check result of the decoding result of the first subflow, and then the base station sends the first demodulation soft information corresponding to the encoded signal and the CRC check result of the decoding result of the first subflow in the encoded signal to the RNC.

In another possible implementation manner, the RNC receives the soft information corresponding to the encoded signals sent by the at least two base stations and the CRC check results of the decoding results of the first subflows in the encoded signals, where the first soft information is first decoding soft information.

In this embodiment, the soft information is decoding soft information rather than demodulation soft information. A difference between the demodulation soft information and the decoding soft information is that: The decoding demodulator disposed in the base station demodulates the first subflow in the distorted encoded signal into the base-n information sequence of the log-likelihood ratio sequence, that is, after the base station obtains the first demodulation soft information, the base station decodes the first demodulation soft information to obtain the first decoding soft information. In a specific implementation process, any soft input/soft output decoding algorithm is applicable to this embodiment.

Other implementation processes of this embodiment are similar to the possible implementation manners corresponding to the first demodulation soft information, and are not described herein again in this embodiment. Finally, the base station sends the first decoding soft information corresponding to the encoded signal and the CRC check result of the decoding result of the first subflow in the encoded signal to the RNC.

In step 102, the RNC performs the selective combining according to the at least two CRC check results of the decoding results of the first subflows, and obtains the selective combining result of the first subflows.

A person skilled in the art may understand that, in a specific implementation process, there are at least two base stations. Therefore, for the RNC, the RNC finally acquires at least two CRC check results of decoding results of first subflows, and the RNC needs to perform selective combining on the at least two CRC check results. In this embodiment, a final result of selective combining is referred to as a selective combining result of the first subflows. In a process of performing selective combining by the RNC, as long as one CRC check result of a decoding result of a first subflow is 0, a first combining result is CRC=0, that is, the selective combining result of the first subflow is that CRC check is correct. When no CRC check result of a decoding result of a first subflow is 0, the first combining result is 1, that is, the selective combining result of the first subflow is that CRC check is incorrect.

Optionally, before step 102, the RNC further receives the decoding results of the first subflows sent by the at least two base stations and bit error rates corresponding to the decoding results of the first subflows, and a person skilled in the art may understand that there is no strict time sequence between the receiving process and step 101.

Correspondingly, if the selective combining result of the first subflows is that CRC check is correct, the RNC determines, among the decoding results of the first subflows whose CRC check is correct, a decoding result of a first subflow having a lowest bit error rate, and sends, to the core network, the decoding result of the first subflow having the lowest bit error rate.

In step 103, when the selective combining result of the first subflows is that CRC check is incorrect, the soft combining result of the first subflows is determined according to the at least two pieces of first soft information.

As can be seen from step 101, the first soft information may be classified into first demodulation soft information or first decoding soft information. Therefore, there are two possible implementation manners in which the RNC determines the soft combining result of the first subflows according to the at least two pieces of first soft information.

In one possible implementation manner, when the first soft information is first demodulation soft information, the RNC obtains first accumulated demodulation soft information by accumulating at least two pieces of the first demodulation soft information, acquires a first accumulated decoding result by decoding the first accumulated demodulation soft information, and uses the first accumulated decoding result as the soft combining result of the first subflows.

Two pieces of first demodulation soft information are used as an example. One piece of first demodulation soft information is [a1, a2, a3, . . . , an], and the other piece of first demodulation soft information is [b1, b2, b3, . . . , bn]. In this case, the first accumulated demodulation soft information is [a1+b1, a2+b2, a3+b3, . . . , an+bn]. A process of accumulating the first demodulation soft information is equivalent to maximum ratio combining, where a and b are integers, and n is a natural number. The first accumulated demodulation soft information is decoded to acquire the first accumulated decoding result. A person skilled in the art may understand that any soft input decoding method is applicable to this embodiment, and is not specifically limited in this embodiment. After obtaining the first accumulated decoding result, the RNC uses the first accumulated decoding result as the soft combining result of the first subflows, and sends the soft combining result of the first subflows to the core network.

In another possible implementation manner, when the first soft information is first decoding soft information, the RNC accumulates at least two pieces of the first decoding soft information to obtain first accumulated decoding soft information, performs hard decision on the first accumulated decoding soft information, and uses a hard decision result as the soft combining result of the first subflows.

Two pieces of first decoding soft information are used as an example. One piece of first decoding soft information is [c1, c 2, c 3, . . . , cn], and the other piece of first decoding soft information is [d1, d2, d3, . . . , dn]. In this case, the first accumulated decoding soft information is [c1+d1, c2+d2, c3+d3, . . . , cn+dn]. A process of accumulating the first decoding soft information is equivalent to maximum ratio combining, where c and d are integers, and n is a natural number. Hard decision is performed on the first accumulated decoding soft information, and a specific process of hard decision is: If the first decoding soft information is greater than or equal to 0, a corresponding hard decision result is 1, or if the first decoding soft information is less than 0, a corresponding hard decision result is 0. After obtaining the hard decision result, the RNC uses the hard decision result as the soft combining result of the first subflows, and sends the soft combining result of the first subflows to the core network.

As can be seen above, in this embodiment, decoding is performed on the encoded signal twice. When the first soft information is first demodulation soft information, when receiving the encoded signal sent by the mobile station, the base station performs the first time of decoding on the encoded signal, that is, the decoding result of the first subflows is obtained. When the selective combining result of the first subflows is that CRC check is incorrect, the RNC decodes the first accumulated demodulation soft information (which is the second time of decoding) to acquire a first accumulated decoding result, that is, the soft combining result of the first subflows.

When the first soft information is first decoding soft information, when receiving the encoded signal sent by the mobile station, the base station performs the first time of decoding on the encoded signal, that is, the decoding result of the first subflows is obtained. At the same time, the base station decodes the first demodulation soft information to obtain the first decoding soft information; and the RNC acquires first accumulated decoding soft information according to the first decoding soft information, and performs hard decision on the first accumulated decoding soft information to obtain a hard decision result, which is the second time of decoding.

In the prior art, when the first selective combining result is that CRC check is incorrect, a decoding process ends. However, in this embodiment, when the first selective combining result is that CRC check is incorrect, the decoding process does not end; instead, a second time of decoding is performed, thereby improving decoding performance.

In this embodiment of the present disclosure, an RNC receives soft information corresponding to encoded signals sent by at least two base stations and CRC check results of decoding results of first subflows in the encoded signals, to obtain at least two pieces of the soft information and at least two CRC check results of the decoding results of the first subflows, where the soft information includes first soft information corresponding to the first subflows; performs selective combining according to the at least two CRC check results of the decoding results of the first subflows to obtain a selective combining result of the first subflows; and if the selective combining result of the first subflows is that CRC check is incorrect, determines a soft combining result of the first subflows according to at least two pieces of the first soft information. In this embodiment, not only two decoding processes are performed, and in the second decoding process, maximum ratio soft combining is performed by using soft information, so that a macro diversity gain of a soft handover is fully used, thereby greatly improving performance.

Figure 2:
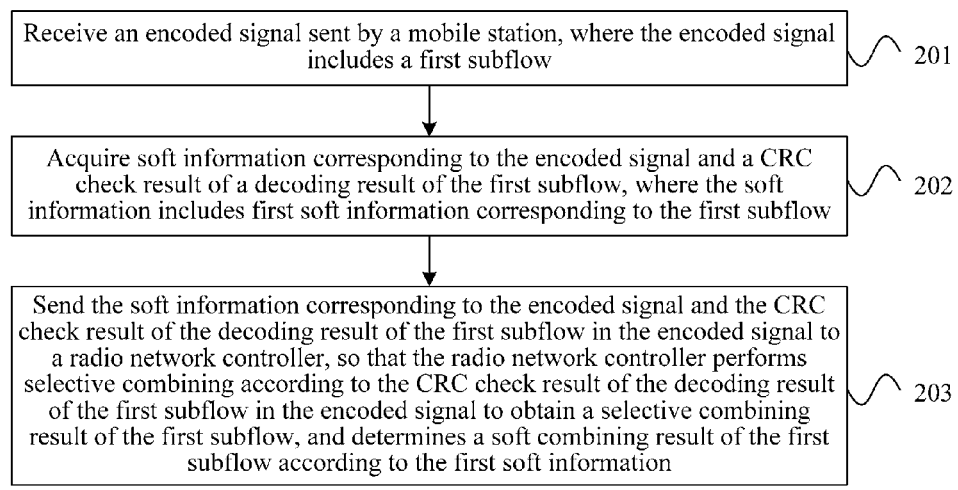
FIG. 2 is a flowchart of Embodiment 2 of a signal processing method according to the present disclosure.

FIG. 2 is a flowchart of Embodiment 2 of a signal processing method according to the present disclosure. An execution body of this embodiment is a base station. The base station may be implemented by using software and/or hardware. The signal processing method provided in this embodiment includes:

Step 201: Receive an encoded signal sent by a mobile station, where the encoded signal includes a first subflow.

Step 202: Acquire soft information corresponding to the encoded signal and a CRC check result of a decoding result of the first subflow, where the soft information includes first soft information corresponding to the first subflow.

Step 203: Send the soft information corresponding to the encoded signal and the CRC check result of the decoding result of the first subflow in the encoded signal to a radio network controller, for the radio network controller performing selective combining according to the CRC check result of the decoding result of the first subflow in the encoded signal to obtain a selective combining result of the first subflow, and determining a soft combining result of the first subflow according to the first soft information.

For an application scenario of this embodiment, refer to the application scenario shown in the embodiment in FIG. 1, which is not described herein again in this embodiment.

In step 201, the base station receives the encoded signal sent by the mobile station, where the encoded signal includes the first subflow.

In step 202 and step 203, the base station acquires and sends the soft information corresponding to the encoded signal and the CRC check result of the decoding result of the first subflow in the encoded signal to an RNC, so that the RNC acquires the selective combining result of the first subflow, or the RNC acquires the soft combining result of the first subflow. The soft information includes first soft information corresponding to the first subflow. The first soft information may be first demodulation soft information or first decoding soft information.

For specific implementation processes of step 202 and step 203, refer to the description of step 101, which is not described herein again in this embodiment.

Optionally, the base station sends the decoding result of the first subflow in the encoded signal and a bit error rate corresponding to the decoding result of the first subflow to the radio network controller, so that the radio network controller determines a decoding result of a first subflow having a lowest bit error rate.

In this provided embodiment of the present disclosure, a base station acquires soft information corresponding to an encoded signal and a CRC check result of a decoding result of a first subflow in the encoded signal, where the soft information includes first soft information corresponding to the first subflow; and sends the soft information corresponding to the encoded signal and the CRC check result of the decoding result of the first subflow in the encoded signal to a radio network controller, so that the radio network controller performs selective combining according to the CRC check result of the decoding result of the first subflow in the encoded signal to obtain a selective combining result of the first subflow, and determines a soft combining result of the first subflow according to the first soft information. In this embodiment, an RNC is enabled to perform maximum ratio soft combining by using soft information, so that a macro diversity gain of a soft handover is fully used, thereby greatly improving performance.

On the basis of the embodiments in FIG. 1 and FIG. 2, the encoded signal further includes a second subflow and a third subflow. In a specific implementation process, the encoded signal may be an encoded speech signal. The encoded speech signal may be an uplink adaptive multi-rate (AMR) encoded speech signal. The AMR speech signal includes three subflows A, B, and C, which are correspondingly a first subflow, a second subflow, and a third subflow. The first subflow, that is, the subflow A, includes CRC. Neither the second subflow nor the third subflow includes CRC. Therefore, for the second subflow and the third subflow, that is, the subflow B and the subflow C, decoding processing can be performed by using a decoder in the prior art, to obtain decoding results of the second subflow and the third subflow.

Several embodiments are used below to further describe in detail a technical solution in which the encoded signal includes the second subflow and the third subflow.

In a possible implementation manner, the soft information further includes second demodulation soft information corresponding to the second subflow and third demodulation soft information corresponding to the third subflow.

In a specific implementation process, the soft information sent by each base station and received by the RNC further includes second demodulation soft information and third demodulation soft information.

For the second demodulation soft information and the third demodulation soft information that are sent by the at least two base stations, the RNC performs the following processing:

accumulating, by the RNC, at least two pieces of the second demodulation soft information to obtain second accumulated demodulation soft information, decoding the second accumulated demodulation soft information to acquire a second accumulated decoding result, and using the second accumulated decoding result as a first soft combining result of the second subflows; and accumulating, by the RNC, at least two pieces of the third demodulation soft information to obtain third accumulated demodulation soft information, decoding the third accumulated demodulation soft information to acquire a third accumulated decoding result, and using the third accumulated decoding result as a first soft combining result of the third subflows.

A processing process of accumulating at least two pieces of the second demodulation soft information and at least two pieces of the third demodulation soft information by the RNC is similar to the process of accumulating at least two pieces of the first demodulation soft information by the RNC, which is not described herein again in this embodiment.

In this embodiment, the RNC sends the first soft combining result of the second subflows and the first soft combining result of the third subflows to a core network, so that the core network performs a subsequent communication process.

In another possible implementation manner, the soft information further includes second decoding soft information corresponding to the second subflow and third decoding soft information corresponding to the third subflow.

In a specific implementation process, the soft information sent by each base station and received by the RNC further includes second decoding soft information and third decoding soft information.

For the second decoding soft information and the third decoding soft information sent by the at least two base stations, the RNC performs the following processing:

accumulating, by the RNC, at least two pieces of the second decoding soft information to obtain second accumulated decoding soft information, performing hard decision on the second accumulated decoding soft information, and using a hard decision result as a second soft combining result of the second subflows; and accumulating, by the RNC, at least two pieces of the third decoding soft information to obtain third accumulated decoding soft information, performing hard decision on the third accumulated decoding soft information, and using a hard decision result as a second soft combining result of the third subflows.

A processing process of accumulating at least two pieces of the second decoding soft information and at least two pieces of the third decoding soft information by the RNC is similar to a process of accumulating at least two pieces of the first decoding soft information by the RNC, which is not described herein again in this embodiment.

In this embodiment, the RNC sends the second soft combining result of the second subflows and the second soft combining result of the third subflows to a core network, so that the core network performs a subsequent communication process.

In another possible implementation manner, to reduce a transmission traffic load of a private interface, the base station simplifies the second demodulation soft information and the third demodulation soft information.

Specifically, the base station encodes a decoding result of the second subflow to obtain an encoded bit of the second subflow, and generates, according to the encoded bit of the second subflow and second demodulation soft information corresponding to the second subflow, a second soft metric corresponding to the second subflow. In a specific implementation process, the encoded bit of the second subflow and the second demodulation soft information are multiplied to generate the second soft metric.

The base station encodes a decoding result of the third subflow to obtain an encoded bit of the third subflow, and generates, according to the encoded bit of the third subflow and third demodulation soft information corresponding to the third subflow, a third soft metric corresponding to the third subflow. In a specific implementation process, the encoded bit of the third subflow and the third demodulation soft information are multiplied to generate the third soft metric.

A person skilled in the art may understand that implementation manners of the second soft metric and the third soft metric are the same. In this embodiment, the second soft metric is used as an example for detailed description.

The base station first acquires the second subflow in the encoded signal, decodes the second subflow to obtain a decoding result of the second subflow, and then encodes the decoding result of the second subflow to obtain an encoded bit of the second subflow. A person skilled in the art may understand that in a decoding process, the base station performs corresponding error correction on the acquired second subflow in the encoded signal. Therefore, as compared with the second subflow in the encoded signal, the encoded bit of the second subflow is closer to an encoded bit of a source signal. For instance, the encoded bit of the second subflow may be [101011], and the second demodulation soft information corresponding to the second subflow is [5, 6, 1, 3, −2, 1]. Therefore, during calculation of the second soft metric, each 0 in the encoded bit of the second subflow is first changed to −1 to obtain [1, −1, 1, −1, 1, 1], and therefore a value of the second soft metric is 1×5+(−1)×6+1×1+(−1)×3+1×(−2)+1×1=−4.

Therefore, the soft information sent by the base station to the RNC further includes the second soft metric corresponding to the second subflow and the third soft metric corresponding to the third subflow. Further, the base station further sends the decoding result of the second subflow and the decoding result of the third subflow to the RNC.

In a process of a soft handover, the RNC receives the decoding results of the second subflows and the decoding results of the third subflows that are sent by the at least two base stations;

compares the second soft metrics corresponding to the second subflows, and uses a decoding result of a second subflow corresponding to a maximum second soft metric as a third soft combining result of the second subflows; and compares the third soft metrics corresponding to the third subflows, and uses a decoding result of a third subflow corresponding to a maximum third soft metric as a third soft combining result of the third subflows.

In this embodiment, the RNC sends the third soft combining result of the second subflows and the third soft combining result of the third subflows to a core network, so that the core network performs a subsequent communication process.

In this embodiment of the present disclosure, the second subflow and the third subflow are processed, so that performance of the second subflow and the third subflow is ensured, and quality of service (QoS) of the first subflow, the second subflow, and the third subflow is balanced.

On the basis of the foregoing embodiments, after obtaining the selective combining result of the first subflows and the soft combining result of the first subflows, the RNC sends the selective combining result of the first subflows to an outer loop power control module; or the RNC performs CRC check on the soft combining result of the first subflows, and sends a check result to an outer loop power control module.

In a specific implementation process, in outer loop power control, a same target block error rate (BLER) is preset for the first subflow, the second subflow, and the third subflow. Once decoding performance of the first subflow is improved, a BLER of the first subflow is less than a target BLER set by outer loop power control. Therefore, outer loop power control needs to reduce AMR power. However, once AMR power is lowered, a final result of the reduction is that a BLER of the first subflow remains unchanged, but BLERs of the second subflow and the third subflow are increased, resulting in a decrease in a mean opinion score (MOS) of speech. It is found through experiments that if AMR power is reduced by 0.3 dB, a MOS is reduced by about 0.1 point.

In a specific implementation process, the RNC sends a CRC check result of the selective combining result of the first subflows (decoding performance of the corresponding first subflows is low) to an outer loop power control module, to ensure that only speech quality is improved without affecting outer loop power control (that is, transmit power is not affected). The RNC sends the CRC check result of the soft combining result of the first subflows (decoding performance of the corresponding first subflows is desirable) to the outer loop power control module, thereby improving a BLER of outer loop power control, that is, lowering transmit power; at the same time, because accumulated decoding is performed on the second subflow and the third subflow by using the soft information to obtain gains, quality of speech is also improved.

Figure 3:
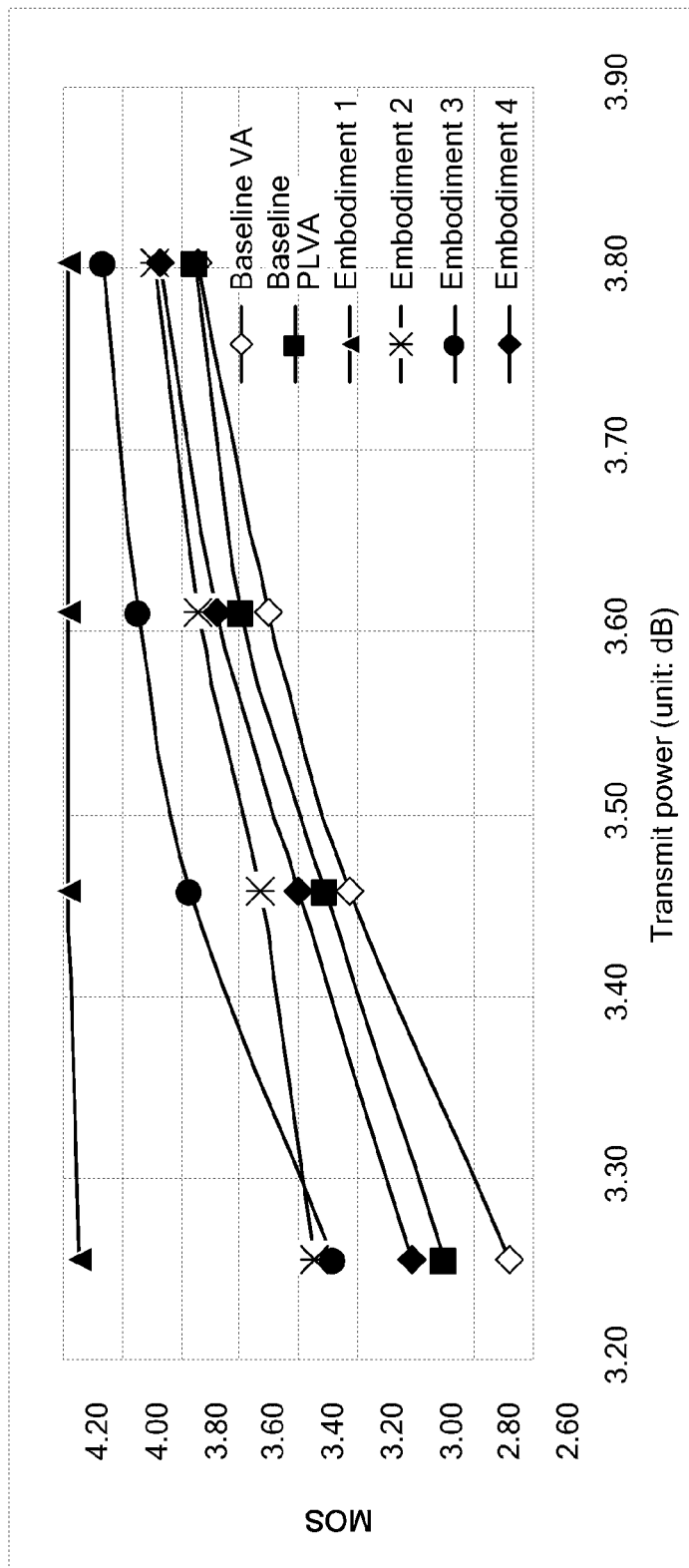
FIG. 3 is a schematic diagram of simulation of MOS performance on a CASE3 channel according to the present disclosure.

The technical solutions of the present disclosure are described in detail below by using several specific embodiments and comparison embodiments and in combination with simulation experiments. The embodiments listed below are described for that an encoded signal is an encoded speech signal and includes a first subflow, a second subflow, and a third subflow, a selective combining result of the first subflow is that CRC check is incorrect, and a soft combining result of the first subflow is determined according to at least two pieces of first soft information. For MOS performance corresponding to the embodiments, refer to FIG. 3. FIG. 3 is a diagram of simulation performance on a CASE3 channel of the embodiments.

Comparison Embodiment 1

A method in the prior art in the background is used, and base stations use a Viterbi algorithm (VA) to perform decoding processing on first subflows, second subflows, and third subflows. The base stations send decoding results of the first subflows, the second subflows, and the third subflows and CRC check results of the decoding results of the first subflows to an RNC. The RNC performs selective combining on the multiple CRC check results, sends, to an outer loop power control module, a result in which a selective combining result is that CRC check is incorrect, and selects, among all links, a decoding result having a lowest bit error rate and sends the decoding result to a core network. For an obtained curve of MOS performance, refer to a baseline VA in FIG. 3.

Comparison Embodiment 2

A method in the prior art in the background is used, and base stations use a parallel list Viterbi algorithm (PLVA) to perform decoding processing on first subflows, second subflows, and third subflows. The base stations send decoding results of the first subflows, the second subflows, and the third subflows and CRC check results of the decoding results of the first subflows to an RNC. The RNC performs selective combining on multiple CRC check results, sends, to an outer loop power control module, a result in which a selective combining result is that CRC check is incorrect, and selects, among all links, a decoding result having a lowest bit error rate and sends the decoding result to a core network. For an obtained curve of MOS performance, refer to a baseline PLVA in FIG. 3.

Embodiment 1

Each first subflow is first demodulation soft information, each second subflow is second demodulation soft information, and each third subflow is third demodulation soft information.

When base stations send the first demodulation soft information, the second demodulation soft information, and the third demodulation soft information to an RNC, a newly added private interface is used for implementation. In a transmission process, the base stations need to perform 6-bit quantization on the first demodulation soft information, the second demodulation soft information, and the third demodulation soft information. The traffic of the newly added private interface is about 19 times as large as that in the prior art. In a case of 4-bit quantization, the traffic of the newly added private interface is about 13 times as large as that in the prior art. The prior art refers to traffic generated when a base station performs 8-bit quantization on demodulation data, then performs decoding, and sends a decoding result to an RNC.

The RNC accumulates at least two pieces of the first demodulation soft information to obtain first accumulated demodulation soft information, decodes the first accumulated demodulation soft information to acquire a first accumulated decoding result, uses the first accumulated decoding result as a soft combining result of the first subflows, and sends the soft combining result of the first subflows to a core network; sends a selective combining result of the first subflows to an outer loop power control module; or performs CRC check on the soft combining result of the first subflows, and sends a check result to an outer loop power control module.

The RNC accumulates at least two pieces of the second demodulation soft information to obtain second accumulated demodulation soft information, decodes the second accumulated demodulation soft information to acquire a second accumulated decoding result, and uses the second accumulated decoding result as a first soft combining result of the second subflows; and accumulates at least two pieces of the third demodulation soft information to obtain third accumulated demodulation soft information, decodes the third accumulated demodulation soft information to acquire a third accumulated decoding result, and uses the third accumulated decoding result as a first soft combining result of the third subflow; and sends the first soft combining result of the second subflows and the first soft combining result of the third subflows to the core network.

Embodiment 2

Each first subflow is first demodulation soft information, each second subflow is a second soft metric, and each third subflow is a third soft metric. For a specific processing manner, refer to the foregoing embodiments.

When base stations send the first demodulation soft information, the second soft metric, and the third soft metric to an RNC, a newly added private interface is used for implementation. In a transmission process, the base stations need to perform 6-bit quantization on the first demodulation soft information and perform 8-bit quantization on the second soft metric and the third soft metric. The traffic of the newly added private interface is about 19 times as large as that in the prior art. In a case of 4-bit quantization, the traffic of the newly added private interface is about two times as large as that in the prior art. As compared with Embodiment 1, in Embodiment 2, a traffic load is reduced by using a simplified process.

The RNC accumulates at least two pieces of the first demodulation soft information to obtain first accumulated demodulation soft information, decodes the first accumulated demodulation soft information to acquire a first accumulated decoding result, uses the first accumulated decoding result as a soft combining result of the first subflows, and sends the soft combining result of the first subflows to a core network; sends a selective combining result of the first subflows to an outer loop power control module; or performs CRC check on the soft combining result of the first subflows, and sends a check result to an outer loop power control module.

The RNC receives decoding results of the second subflows and decoding results of the third subflows that are sent by the at least two base stations; compares the second soft metrics corresponding to the second subflows, and uses a decoding result of a second subflow corresponding to a maximum second soft metric as a third soft combining result of the second subflows; and compares the third soft metrics corresponding to the third subflows, and uses a decoding result of a third subflow corresponding to a maximum third soft metric as a third soft combining result of the third subflows; and sends the third soft combining result of the second subflows and the third soft combining result of the third subflows to the core network.

Embodiment 3

Each first subflow is first decoding soft information, each second subflow is second decoding soft information, and each third subflow is third decoding soft information.

When base stations send the first decoding soft information, the second decoding soft information, and the third decoding soft information to an RNC, a newly added private interface is used for implementation. In a transmission process, the base stations need to perform 6-bit quantization on the first decoding soft information, the second decoding soft information, and the third decoding soft information. The traffic of the newly added private interface is about six times as large as that in the prior art. In a case of 4-bit quantization, the traffic of the newly added private interface is about four times as large as that in the prior art.

The RNC accumulates at least two pieces of the first decoding soft information to obtain first accumulated decoding soft information; performs hard decision on the first accumulated decoding soft information, uses a hard decision result as a soft combining result of the first subflows, and sends the soft combining result of the first subflows to a core network; sends a selective combining result of the first subflows to an outer loop power control module; or performs CRC check on the soft combining result of the first subflows, and sends a check result to an outer loop power control module.

The RNC accumulates at least two pieces of the second decoding soft information to obtain second accumulated decoding soft information, performs hard decision on the second accumulated decoding soft information, and uses a hard decision result as a second soft combining result of the second subflows; and accumulates at least two pieces of the third decoding soft information to obtain third accumulated decoding soft information, performs hard decision on the third accumulated decoding soft information, and uses a hard decision result as a second soft combining result of the third subflows; and sends the second soft combining result of the second subflows and the second soft combining result of the third subflows to the core network.

Embodiment 4

Each first subflow is first decoding soft information, each second subflow is a second soft metric, and each third subflow is a third soft metric.

When base stations send the first decoding soft information, the second soft metric, and the third soft metric to an RNC, a newly added private interface is used for implementation. In a transmission process, the base stations need to perform 6-bit quantization on the first decoding soft information and perform 8-bit quantization on the second soft metric and the third soft metric. The traffic of the newly added private interface is about one time as large as that in the prior art. As compared with Embodiment 3, in Embodiment 4, a traffic load is reduced by using a simplified process.

The RNC accumulates at least two pieces of the first decoding soft information to obtain first accumulated decoding soft information; performs hard decision on the first accumulated decoding soft information, uses a hard decision result as a soft combining result of the first subflows, and sends the soft combining result of the first subflows to a core network; sends a selective combining result of the first subflows to an outer loop power control module; or performs CRC check on the soft combining result of the first subflows, and sends a check result to an outer loop power control module.

The RNC receives decoding results of the second subflows and decoding results of the third subflows that are sent by the at least two base stations; compares the second soft metrics corresponding to the second subflows, and uses a decoding result of a second subflow corresponding to a maximum second soft metric as a third soft combining result of the second subflows; and compares the third soft metrics corresponding to the third subflows, and uses a decoding result of a third subflow corresponding to a maximum third soft metric as a third soft combining result of the third subflows; and sends the third soft combining result of the second subflows and the third soft combining result of the third subflows to the core network.

For curves of MOS performance corresponding to Embodiment 1 to Embodiment 4, refer to FIG. 3. As can be seen from FIG. 3, because soft information is not used to perform a second time of decoding in Comparison Embodiment 1 and Comparison Embodiment 2, MOS scores of speech in Comparison Embodiment 1 and Comparison Embodiment 2 are the lowest. Because in Embodiment 1, demodulation soft information is used for each subflow, and the demodulation soft information is not simplified, a MOS score of speech in Embodiment 1 is the greatest. In Embodiment 3, decoding soft information is used for each subflow, the decoding soft information is obtained by decoding the demodulation soft information by the base station, and the decoding soft information is not simplified in Embodiment 3; therefore, a MOS score in Embodiment 3 is less than that in Embodiment 1 and is greater than those in Embodiment 2 and Embodiment 4. In Embodiment 2 and Embodiment 4, the second subflow and the third subflow are both properly simplified, the soft information is the second soft metric and the third soft metric, but first demodulation soft information is used for the first subflow in Embodiment 2, and first decoding soft information is used for the first subflow in Embodiment 4; therefore, a MOS score of speech in Embodiment 2 is greater than that in Embodiment 4.

Further, as can be seen from FIG. 3, in Embodiment 1, when transmit power of a mobile station is 3.3 dB, there is basically no errored frame, and a MOS score reaches a maximum value. In other embodiments, as the transmit power of the mobile station increases, the MOS score increases. Therefore, a person skilled in the art may understand that, if a MOS score same as that in Comparison Embodiment 1 and Comparison Embodiment 2 is reached in Embodiment 1 to Embodiment 4, the transmit power of the mobile station in Embodiment 1 to Embodiment 4 can be reduced. If the mobile station is at same transmit power in Embodiment 1 to Embodiment 4, an obtained MOS score is greater.

Figure 4:
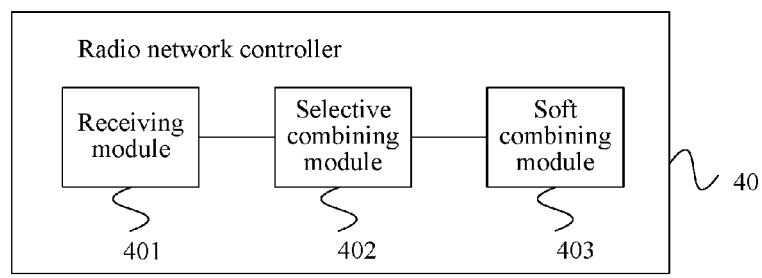
FIG. 4 is a schematic structural diagram of Embodiment 1 of a radio network controller according to the present disclosure.

FIG. 4 is a schematic structural diagram of Embodiment 1 of a radio network controller according to the present disclosure. As shown in FIG. 4, the radio network controller 40 provided in this embodiment of the present disclosure includes a receiving module 401, a selective combining module 402, and a soft combining module 403.

The receiving module 401 is configured to receive soft information corresponding to encoded signals sent by at least two base stations and CRC check results of decoding results of first subflows in the encoded signals, to obtain at least two pieces of the soft information and at least two CRC check results of the decoding results of the first subflows, where the soft information includes first soft information corresponding to the first subflows.

The selective combining module 402 is configured to perform selective combining according to the at least two CRC check results of the decoding results of the first subflows to obtain a selective combining result of the first subflows.

The soft combining module 403 is configured to: if the selective combining result of the first subflows is that CRC check is incorrect, determine a soft combining result of the first subflows according to at least two pieces of the first soft information.

The radio network controller provided in this embodiment of the present disclosure can be used to execute the technical solutions of the foregoing method embodiments, and implementation principles and technical effects thereof are similar, and are not described herein again.

Figure 5:
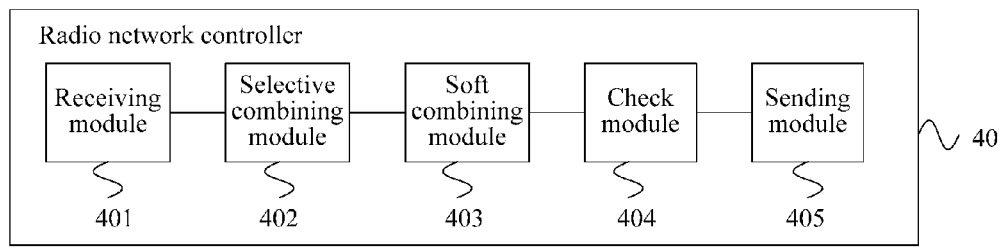
FIG. 5 is a schematic structural diagram of Embodiment 2 of a radio network controller according to the present disclosure.

FIG. 5 is a schematic structural diagram of Embodiment 2 of a radio network controller according to the present disclosure. As shown in FIG. 5, this embodiment is implemented on the basis of the embodiment in FIG. 4, and is as follows:

Optionally, the first soft information is first demodulation soft information, and the soft combining module 403 is configured to:

accumulate at least two pieces of the first demodulation soft information to obtain first accumulated demodulation soft information; and decode the first accumulated demodulation soft information to acquire a first accumulated decoding result, and use the first accumulated decoding result as the soft combining result of the first subflows.

Optionally, the first soft information is first decoding soft information, the soft combining module 403 is configured to:

accumulate at least two pieces of the first decoding soft information to obtain first accumulated decoding soft information; and perform hard decision on the first accumulated decoding soft information, and use a hard decision result as the soft combining result of the first subflows.

Optionally, the encoded signals further include second subflows and third subflows, and the soft information further includes second demodulation soft information corresponding to the second subflows and third demodulation soft information corresponding to the third subflows; and the soft combining module 403 is further configured to:

accumulate at least two pieces of the second demodulation soft information to obtain second accumulated demodulation soft information, decode the second accumulated demodulation soft information to acquire a second accumulated decoding result, and use the second accumulated decoding result as a first soft combining result of the second subflows; and accumulate at least two pieces of the third demodulation soft information to obtain third accumulated demodulation soft information, decode the third accumulated demodulation soft information to acquire a third accumulated decoding result, and use the third accumulated decoding result as a first soft combining result of the third subflows.

Optionally, the encoded signals further include second subflows and third subflows, and the soft information further includes second decoding soft information corresponding to the second subflows and third decoding soft information corresponding to the third subflows; and the soft combining module 403 is further configured to:

accumulate at least two pieces of the second decoding soft information to obtain second accumulated decoding soft information, perform hard decision on the second accumulated decoding soft information, and use a hard decision result as a second soft combining result of the second subflows; and accumulate at least two pieces of the third decoding soft information to obtain third accumulated decoding soft information, perform hard decision on the third accumulated decoding soft information, and use a hard decision result as a second soft combining result of the third subflows.

Optionally, the encoded signals further include second subflows and third subflows, and the soft information further includes second soft metrics corresponding to the second subflows and third soft metrics corresponding to the third subflows; and the receiving module 401 is further configured to:

receive decoding results of the second subflows and decoding results of the third subflows that are sent by the at least two base stations;

compare the second soft metrics corresponding to the second subflows, and use a decoding result of a second subflow corresponding to a maximum second soft metric as a third soft combining result of the second subflows; and compare the third soft metrics corresponding to the third subflows, and use a decoding result of a third subflow corresponding to a maximum third soft metric as a third soft combining result of the third subflows.

Optionally, the receiving module 401 is further configured to: before selective combining is performed according to the at least two CRC check results of the decoding results of the first subflows to obtain the selective combining result of the first subflows, receive the decoding results of the first subflows sent by the at least two base stations and bit error rates corresponding to the decoding results of the first subflows; and the radio network controller further includes:

a check module 404, configured to: if the selective combining result of the first subflows is that CRC check is correct, determine, among the decoding results of the first subflows whose CRC check is correct, a decoding result of a first subflow having a lowest bit error rate.

Optionally, the radio network controller further includes:

a sending module 405, configured to: after the soft combining result of the first subflows is determined according to the at least two pieces of first soft information, send the selective combining result of the first subflows to an outer loop power control module, so that the outer loop power control module controls transmit power of a mobile station; or perform CRC check on the soft combining result of the first subflows, and send a check result to an outer loop power control module, so that the outer loop power control module controls transmit power of a mobile station.

The radio network controller provided in this embodiment of the present disclosure can be used to execute the technical solutions of the foregoing method embodiments, and implementation principles and technical effects thereof are similar, and are not described herein again.

Figure 6:
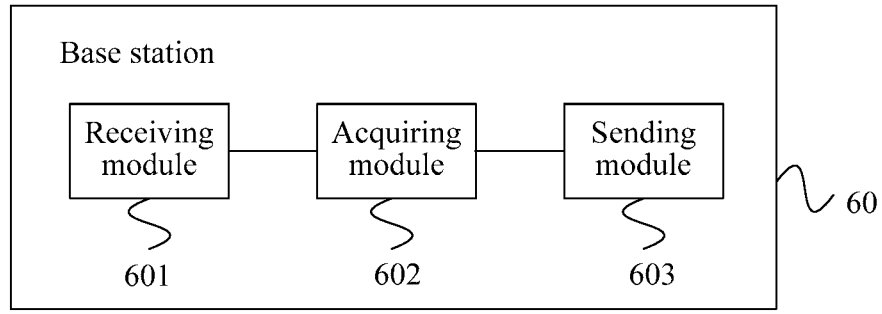
FIG. 6 is a schematic structural diagram of Embodiment 1 of a base station according to the present disclosure.

FIG. 6 is a schematic structural diagram of Embodiment 1 of a base station according to the present disclosure. As shown in FIG. 6, the base station 60 provided in this embodiment of the present disclosure includes: a receiving module 601, an acquiring module 602, and a sending module 603.

The receiving module 601 is configured to receive an encoded signal sent by a mobile station, where the encoded signal includes a first subflow.

The acquiring module 602 is configured to acquire soft information corresponding to the encoded signal and a CRC check result of a decoding result of the first subflow, where the soft information includes first soft information corresponding to the first subflow.

The sending module 603 is configured to send the soft information corresponding to the encoded signal and the CRC check result of the decoding result of the first subflow in the encoded signal to a radio network controller, so that the radio network controller performs selective combining according to the CRC check result of the decoding result of the first subflow in the encoded signal to obtain a selective combining result of the first subflow, and determines a soft combining result of the first subflow according to the first soft information.

Optionally, the first soft information is first demodulation soft information, or, the first soft information is first decoding soft information.

Optionally, the encoded signal further includes a second subflow and a third subflow, and the soft information further includes second demodulation soft information corresponding to the second subflow and third demodulation soft information corresponding to the third subflow.

Optionally, the encoded signal further includes a second subflow and a third subflow, and the soft information further includes second decoding soft information corresponding to the second subflow and third decoding soft information corresponding to the third subflow.

Optionally, the encoded signal further includes a second subflow and a third subflow, and the base station further includes:

an encoding module, configured to: before the soft information corresponding to the encoded signal and the CRC check result of the decoding result of the first subflow in the encoded signal are sent to the radio network controller, encode a decoding result of the second subflow to obtain an encoded bit of the second subflow, and generate, according to the encoded bit of the second subflow and second demodulation soft information corresponding to the second subflow, a second soft metric corresponding to the second subflow; and encode a decoding result of the third subflow to obtain an encoded bit of the third subflow, and generate, according to the encoded bit of the third subflow and third demodulation soft information corresponding to the third subflow, a third soft metric corresponding to the third subflow, where the soft information further includes the second soft metric corresponding to the second subflow and the third soft metric corresponding to the third subflow.

Optionally, the sending module 603 is further configured to:

send the decoding result of the first subflow in the encoded signal and a bit error rate corresponding to the decoding result of the first subflow to the radio network controller, so that the radio network controller determines a decoding result of a first subflow having a lowest bit error rate.

The base station provided in this embodiment of the present disclosure can be used to execute the technical solutions of the foregoing method embodiments, and implementation principles and technical effects thereof are similar, and are not described herein again.

Figure 7:
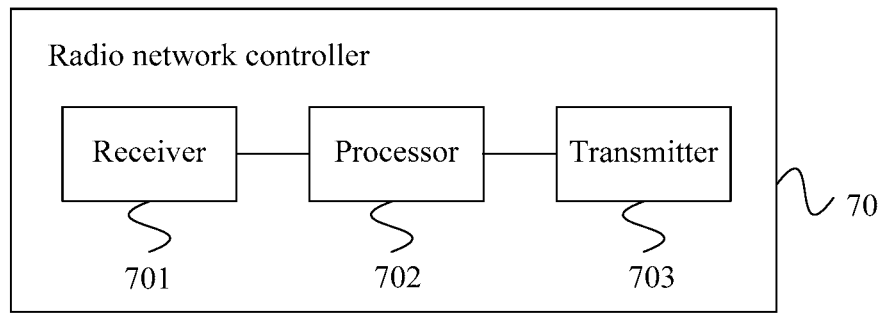
FIG. 7 is a schematic structural diagram of Embodiment 3 of a radio network controller according to the present disclosure.

FIG. 7 is a schematic structural diagram of Embodiment 3 of a radio network controller according to the present disclosure. As shown in FIG. 7, the radio network controller 70 provided in this embodiment of the present disclosure includes a receiver 701, a processor 702, and a transmitter 703.

The receiver 701 is configured to receive soft information corresponding to encoded signals sent by at least two base stations and CRC check results of decoding results of first subflows in the encoded signals, to obtain at least two pieces of the soft information and at least two CRC check results of the decoding results of the first subflows, where the soft information includes first soft information corresponding to the first subflows.

The processor 702 is configured to perform selective combining according to the at least two CRC check results of the decoding results of the first subflows to obtain a selective combining result of the first subflows, and if the selective combining result of the first subflows is that CRC check is incorrect, determine a soft combining result of the first subflows according to at least two pieces of the first soft information.

Optionally, the first soft information is first demodulation soft information, and the processor 702 is configured to:

accumulate at least two pieces of the first demodulation soft information to obtain first accumulated demodulation soft information; and decode the first accumulated demodulation soft information to acquire a first accumulated decoding result, and use the first accumulated decoding result as the soft combining result of the first subflows.

Optionally, the first soft information is first decoding soft information, and the processor 702 is configured to:

accumulate at least two pieces of the first decoding soft information to obtain first accumulated decoding soft information; and perform hard decision on the first accumulated decoding soft information, and use a hard decision result as the soft combining result of the first subflows.

Optionally, the encoded signals further include second subflows and third subflows, and the soft information further includes second demodulation soft information corresponding to the second subflows and third demodulation soft information corresponding to the third subflows; and the processor 702 is further configured to:

accumulate at least two pieces of the second demodulation soft information to obtain second accumulated demodulation soft information, decode the second accumulated demodulation soft information to acquire a second accumulated decoding result, and use the second accumulated decoding result as a first soft combining result of the second subflows; and accumulate at least two pieces of the third demodulation soft information to obtain third accumulated demodulation soft information, decode the third accumulated demodulation soft information to acquire a third accumulated decoding result, and use the third accumulated decoding result as a first soft combining result of the third subflows.

Optionally, the encoded signals further include second subflows and third subflows, and the soft information further includes second decoding soft information corresponding to the second subflows and third decoding soft information corresponding to the third subflows; and the processor 702 is further configured to:

accumulate at least two pieces of the second decoding soft information to obtain second accumulated decoding soft information, perform hard decision on the second accumulated decoding soft information, and use a hard decision result as a second soft combining result of the second subflows; and accumulate at least two pieces of the third decoding soft information to obtain third accumulated decoding soft information, perform hard decision on the third accumulated decoding soft information, and use a hard decision result as a second soft combining result of the third subflows.

Optionally, the encoded signals further include second subflows and third subflows, and the soft information further includes second soft metrics corresponding to the second subflows and third soft metrics corresponding to the third subflows;

the receiver 701 is further configured to receive decoding results of the second subflows and decoding results of the third subflows that are sent by the at least two base stations; and the processor 702 is further configured to:

compare the second soft metrics corresponding to the second subflows, and use a decoding result of a second subflow corresponding to a maximum second soft metric as a third soft combining result of the second subflows; and compare the third soft metrics corresponding to the third subflows, and use a decoding result of a third subflow corresponding to a maximum third soft metric as a third soft combining result of the third subflows.

Optionally, the receiver 701 is further configured to: before selective combining is performed according to the at least two CRC check results of the decoding results of the first subflows to obtain the selective combining result of the first subflows, receive the decoding results of the first subflows sent by the at least two base stations and bit error rates corresponding to the decoding results of the first subflows; and the processor 702 is further configured to:

if the selective combining result of the first subflows is that CRC check is correct, determine, among the decoding results of the first subflows whose CRC check is correct, a decoding result of a first subflow having a lowest bit error rate.

Optionally, the transmitter 703 is configured to: after the soft combining result of the first subflows is determined according to the at least two pieces of first soft information, send the selective combining result of the first subflows to an outer loop power control module, so that the outer loop power control module controls transmit power of a mobile station; or the processor 702 is further configured to: after the soft combining result of the first subflows is determined according to the at least two pieces of first soft information, perform CRC check on the soft combining result of the first subflows, and a transmitter 703 is further configured to send a check result to an outer loop power control module, so that the outer loop power control module controls transmit power of a mobile station.

The radio network controller provided in this embodiment of the present disclosure can be used to execute the technical solutions of the foregoing method embodiments, and implementation principles and technical effects thereof are similar, and are not described herein again.

Figure 8:
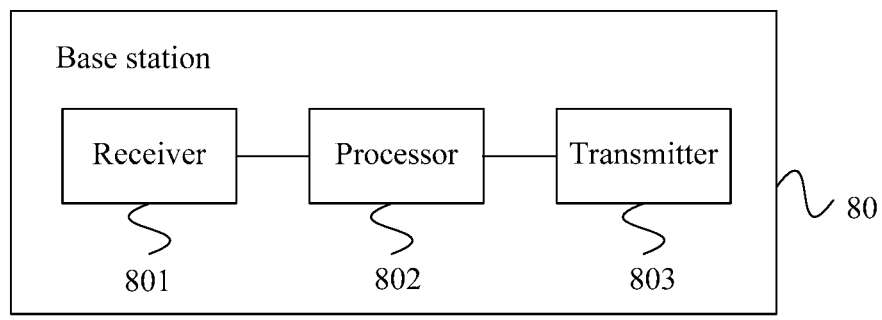
FIG. 8 is a schematic structural diagram of Embodiment 2 of a base station according to the present disclosure.

FIG. 8 is a schematic structural diagram of Embodiment 2 of a base station according to the present disclosure. As shown in FIG. 8, the base station 80 provided in this embodiment of the present disclosure includes a receiver 801, a processor 802, and a transmitter 803.

The receiver 801 is configured to receive an encoded signal sent by a mobile station, where the encoded signal includes a first subflow.

The processor 802 is configured to acquire soft information corresponding to the encoded signal and a CRC check result of a decoding result of the first subflow, where the soft information includes first soft information corresponding to the first subflow.

The transmitter 803 is configured to send the soft information corresponding to the encoded signal and the CRC check result of the decoding result of the first subflow in the encoded signal to a radio network controller, so that the radio network controller performs selective combining according to the CRC check result of the decoding result of the first subflow in the encoded signal to obtain a selective combining result of the first subflow, and determines a soft combining result of the first subflow according to the first soft information.

Optionally, the first soft information is first demodulation soft information, or, the first soft information is first decoding soft information.

Optionally, the encoded signal further includes a second subflow and a third subflow, and the soft information further includes second demodulation soft information corresponding to the second subflow and third demodulation soft information corresponding to the third subflow.

Optionally, the encoded signal further includes a second subflow and a third subflow, and the soft information further includes second decoding soft information corresponding to the second subflow and third decoding soft information corresponding to the third subflow.

Optionally, the encoded signal further includes a second subflow and a third subflow, and the processor 802 is further configured to: before the soft information corresponding to the encoded signal and the CRC check result of the decoding result of the first subflow in the encoded signal are sent to the radio network controller, encode a decoding result of the second subflow to obtain an encoded bit of the second subflow, and generate, according to the encoded bit of the second subflow and second demodulation soft information corresponding to the second subflow, a second soft metric corresponding to the second subflow; and encode a decoding result of the third subflow to obtain an encoded bit of the third subflow, and generate, according to the encoded bit of the third subflow and third demodulation soft information corresponding to the third subflow, a third soft metric corresponding to the third subflow, where the soft information further includes the second soft metric corresponding to the second subflow and the third soft metric corresponding to the third subflow.

Optionally, the transmitter 803 is further configured to: send the decoding result of the first subflow in the encoded signal and a bit error rate corresponding to the decoding result of the first subflow to the radio network controller, so that the radio network controller determines a decoding result of a first subflow having a lowest bit error rate.

Persons of ordinary skill in the art may understand that all or some of the steps of the method embodiments may be implemented by a program instructing related hardware. The program may be stored in a computer-readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A signal processing method, comprising:
   receiving, by a radio network controller (RNC), at least two pieces of soft information corresponding to encoded signals and at least two cyclic redundancy check (CRC) check results from at least two base stations, wherein the CRC check results are obtained from decoded results of first subflows in the encoded signals, and each of the at least two pieces of soft information comprises first soft information corresponding to one of the first subflows;
   obtaining, by the RNC, a selective combining result of the first subflows by performing selective combining according to the at least two CRC check results; and
   if the selective combining result of the first subflows is that CRC check is incorrect, determining, by the RNC, a soft combining result of the first subflows according to the at least two pieces of first soft information.

2. The method according to claim 1, wherein the first soft information is first demodulation soft information, and the determining, by the RNC, a soft combining result of the first subflows according to the at least two pieces of first soft information comprises:
   obtaining, by the RNC, first accumulated demodulation soft information by accumulating at least two pieces of the first demodulation soft information; and
   acquiring, by the RNC, a first accumulated decoding result by decoding the first accumulated demodulation soft information, and using the first accumulated decoding result as the soft combining result of the first subflows.

3. The method according to claim 1, wherein the first soft information is first decoding soft information, and the determining, by the RNC, a soft combining result of the first subflows according to at least two pieces of the first soft information comprises:
   obtaining, by the RNC, first accumulated decoding soft information by accumulating at least two pieces of the first decoding soft information; and
   performing, by the RNC, hard decision on the first accumulated decoding soft information, and using a hard decision result as the soft combining result of the first subflows.

4. The method according to claim 1, wherein the encoded signals further comprise second subflows and third subflows, and the soft information further comprises second demodulation soft information corresponding to the second subflows and third demodulation soft information corresponding to the third subflows; and the method further comprises:
obtaining, by the RNC, second accumulated demodulation soft information by accumulating at least two pieces of the second demodulation soft information, acquiring a second accumulated decoding result by decoding the second accumulated demodulation soft information, and using the second accumulated decoding result as a first soft combining result of the second subflows; and obtaining, by the RNC, third accumulated demodulation soft information by accumulating at least two pieces of the third demodulation soft information, acquiring a third accumulated decoding result by decoding the third accumulated demodulation soft information, and using the third accumulated decoding result as a first soft combining result of the third subflows.

5. The method according to claim 1, wherein the encoded signals further comprise second subflows and third subflows, and the soft information further comprises second decoding soft information corresponding to the second subflows and third decoding soft information corresponding to the third subflows; and the method further comprises:
obtaining, by the RNC, second accumulated decoding soft information by accumulating at least two pieces of the second decoding soft information, performing hard decision on the second accumulated decoding soft information, and using a hard decision result as a second soft combining result of the second subflows; and obtaining, by the RNC, third accumulated decoding soft information by accumulating at least two pieces of the third decoding soft information, performing hard decision on the third accumulated decoding soft information, and using a hard decision result as a second soft combining result of the third subflows.

6. The method according to claim 1, wherein the encoded signals further comprise second subflows and third subflows, and the soft information further comprises second soft metrics corresponding to the second subflows and third soft metrics corresponding to the third subflows; and the method further comprises:
receiving, by the RNC, decoding results of the second subflows and decoding results of the third subflows that are sent by the at least two base stations;

comparing, by the RNC, the second soft metrics corresponding to the second subflows, and using a decoding result of a second subflow corresponding to a maximum second soft metric as a third soft combining result of the second subflows; and comparing, by the RNC, the third soft metrics corresponding to the third subflows, and using a decoding result of a third subflow corresponding to a maximum third soft metric as a third soft combining result of the third subflows.

7. A radio network controller, comprising:
a receiver, configured to receive at least two pieces of soft information corresponding to encoded signals and at least two cyclic redundancy check (CRC) check results from at least two base stations, wherein the CRC check results are obtained from decoded results of first subflows in the encoded signals, and each of the at least two pieces of soft information comprises first soft information corresponding to one of the first subflows; and a processor, configured to:
obtain a selective combining result of the first subflows by performing selective combining according to the at least two CRC check results of the decoding results of the first subflows, and if the selective combining result of the first subflows is that CRC check is incorrect, determine a soft combining result of the first subflows according to the at least two pieces of first soft information.

8. The radio network controller according to claim 7, wherein the first soft information is first demodulation soft information, and the processor is further configured to:
obtain first accumulated demodulation soft information by accumulating at least two pieces of the first demodulation soft information; and acquire a first accumulated decoding result by decoding the first accumulated demodulation soft information, and use the first accumulated decoding result as the soft combining result of the first subflows.

9. The radio network controller according to claim 7, wherein the first soft information is first decoding soft information, and the processor is further configured to:
obtain first accumulated decoding soft information by accumulating at least two pieces of the first decoding soft information; and perform hard decision on the first accumulated decoding soft information, and use a hard decision result as the soft combining result of the first subflows.

10. The radio network controller according to claim 7, wherein:
the encoded signals further comprise second subflows and third subflows, and the soft information further comprises second demodulation soft information corresponding to the second subflows and third demodulation soft information corresponding to the third subflows; and the processor is further configured to:
obtain second accumulated demodulation soft information by accumulating at least two pieces of the second demodulation soft information, acquire a second accumulated decoding result by decoding the second accumulated demodulation soft information, and use the second accumulated decoding result as a first soft combining result of the second subflows; and obtain third accumulated demodulation soft information by accumulating at least two pieces of the third demodulation soft information, decode the third accumulated demodulation soft information to acquire a third accumulated decoding result, and use the third accumulated decoding result as a first soft combining result of the third subflows.

11. The radio network controller according to claim 7, wherein:
the encoded signals further comprise second subflows and third subflows, and the soft information further comprises second decoding soft information corresponding to the second subflows and third decoding soft information corresponding to the third subflows; and the processor is further configured to:
obtain second accumulated decoding soft information by accumulating at least two pieces of the second decoding soft information, perform hard decision on the second accumulated decoding soft information, and use a hard decision result as a second soft combining result of the second subflows; and obtain third accumulated decoding soft information by accumulating at least two pieces of the third decoding soft information, perform hard decision on the third accumulated decoding soft information, and use a hard decision result as a second soft combining result of the third subflows.

12. The radio network controller according to claim 7, wherein:

the encoded signals further comprise second subflows and third subflows, and the soft information further comprises second soft metrics corresponding to the second subflows and third soft metrics corresponding to the third subflows; and the receiver is further configured to receive decoding results of the second subflows and decoding results of the third subflows that are sent by the at least two base stations; and the processor is further configured to:

compare the second soft metrics corresponding to the second subflows, and use a decoding result of a second subflow corresponding to a maximum second soft metric as a third soft combining result of the second subflows; and compare the third soft metrics corresponding to the third subflows, and use a decoding result of a third subflow corresponding to a maximum third soft metric as a third soft combining result of the third subflows.

13. The radio network controller according to claim 7, further comprising:

a transmitter, configured to: after the soft combining result of the first subflows is determined according to the at least two pieces of first soft information, send the selective combining result of the first subflows to an outer loop power control module, so that the outer loop power control module controls transmit power of a mobile station; or the processor is further configured to perform CRC check on the soft combining result of the first subflows, and the transmitter is further configured to send a check result to an outer loop power control module, so that the outer loop power control module controls transmit power of a mobile station.

* * * * *